US010573399B2

(12) United States Patent
Zhang

(10) Patent No.: US 10,573,399 B2
(45) Date of Patent: Feb. 25, 2020

(54) THREE-DIMENSIONAL ONE-TIME-PROGRAMMABLE MEMORY COMPRISING DUMMY BIT LINES

(71) Applicant: Guobiao Zhang, Corvallis, OR (US)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvallis, OR (US)

( * ) Notice: Subject to any disclaimer, the term of this patent is extended or adjusted under 35 U.S.C. 154(b) by 0 days.

(21) Appl. No.: 16/056,873

(22) Filed: Aug. 7, 2018

(65) Prior Publication Data

US 2018/0342307 A1     Nov. 29, 2018

Related U.S. Application Data

(62) Division of application No. 15/488,435, filed on Apr. 14, 2017, now Pat. No. 10,102,917.

(30) Foreign Application Priority Data

Apr. 14, 2016   (CN) .......................... 2016 1 0238012
Aug. 2, 2018    (CN) .......................... 2018 1 0872935

(51) Int. Cl.
| G11C 17/16  | (2006.01) |
| G11C 29/00  | (2006.01) |
| G11C 7/14   | (2006.01) |
| G11C 11/56  | (2006.01) |
| G11C 13/00  | (2006.01) |
| G11C 17/18  | (2006.01) |

(52) U.S. Cl.
CPC .............. *G11C 17/165* (2013.01); *G11C 7/14* (2013.01); *G11C 11/5692* (2013.01); *G11C 13/004* (2013.01); *G11C 13/0069* (2013.01); *G11C 17/16* (2013.01); *G11C 17/18* (2013.01); *G11C 29/78* (2013.01); *G11C 2013/0042* (2013.01); *G11C 2013/0054* (2013.01); *G11C 2013/0078* (2013.01); *G11C 2213/71* (2013.01); *G11C 2216/12* (2013.01)

(58) Field of Classification Search
CPC ....... G11C 17/165; G11C 17/16; G11C 17/18; G11C 17/14; G11C 11/5692; G11C 13/004; G11C 13/0069; G11C 29/78; G11C 2013/0042; G11C 2013/0054; G11C 2013/0078; G11C 2213/71
See application file for complete search history.

(56) References Cited

U.S. PATENT DOCUMENTS

| 4,404,655 A | 9/1983 | Naiff |
| 4,424,579 A | 1/1984 | Roesner |
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |

(Continued)

*Primary Examiner* — Alfredo Bermudez Lozada

(57) ABSTRACT

A multi-bit-per-cell three-dimensional read-only memory (3D-OTP$_{MB}$) comprises a plurality of dummy bit lines. It comprises a plurality of OTP cells stacked above a semiconductor substrate. Each OTP array comprises at least four dummy bit lines.

3 Claims, 11 Drawing Sheets

(56) References Cited

U.S. PATENT DOCUMENTS

| | | |
|---|---|---|
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,624,485 B2 | 9/2003 | Johnson |
| 6,717,222 B2 | 4/2004 | Zhang |
| 2005/0180205 A1* | 8/2005 | Park ................. G11C 7/062 365/171 |
| 2007/0170520 A1* | 7/2007 | Zhang ............... G11C 5/063 257/390 |
| 2014/0204652 A1* | 7/2014 | Lee ............... G11C 29/50008 365/148 |

\* cited by examiner

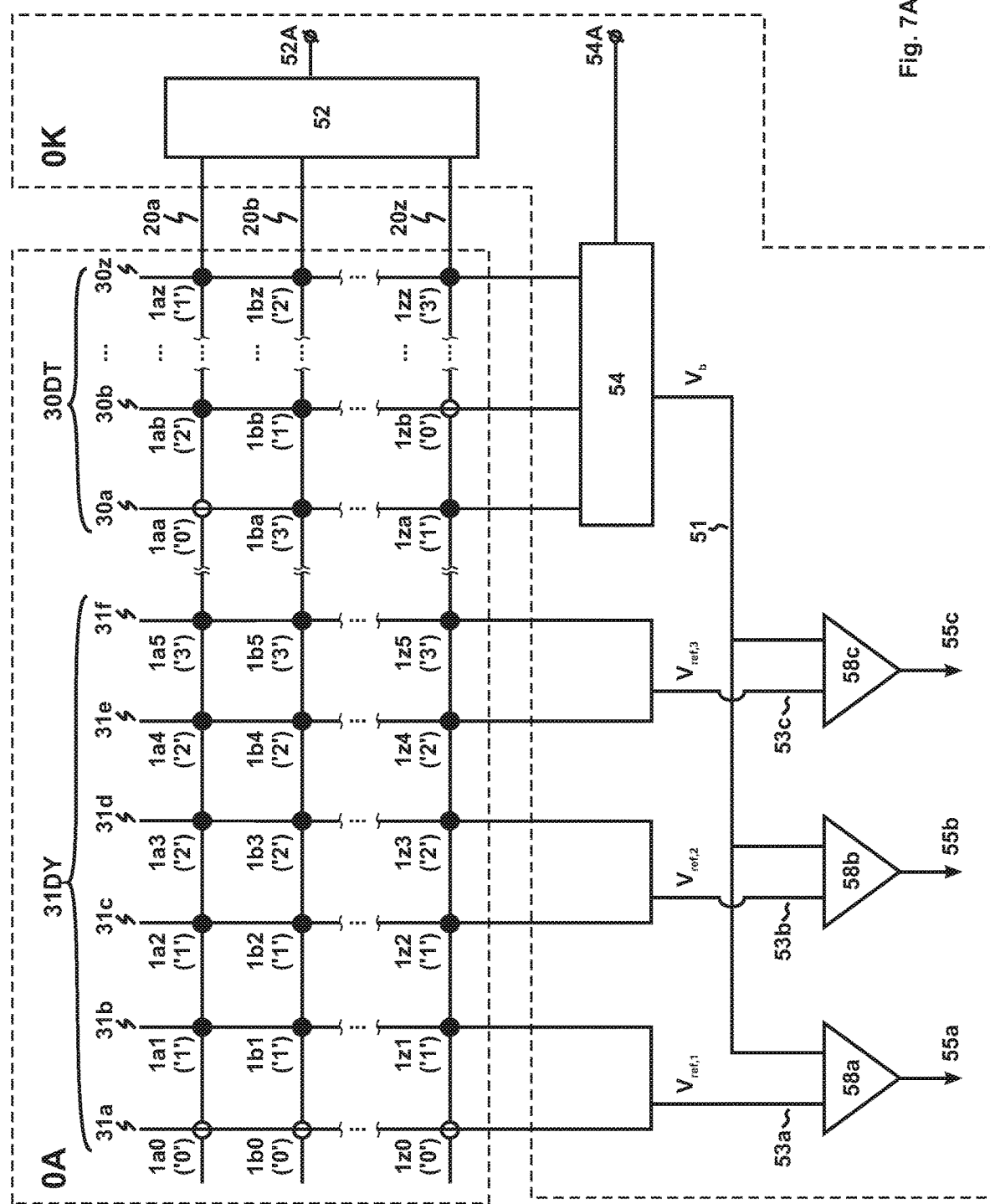

THREE-DIMENSIONAL ONE-TIME-PROGRAMMABLE MEMORY COMPRISING DUMMY BIT LINES

CROSS-REFERENCE TO RELATED APPLICATIONS

This application is a division of U.S. patent application Ser. No. 15/488,435, filed Apr. 14, 2017, which claims priority from Chinese Patent Application 201610238012.7, filed on Apr. 14, 2016; Chinese Patent Application 201810860764.6, filed on Aug. 1, 2018; Chinese Patent Application 201810872935.7, filed on Aug. 2, 2018, in the State Intellectual Property Office of the People's Republic of China (CN), the disclosure of which is incorporated herein by reference in its entirety.

BACKGROUND

1. Technical Field of the Invention

The present invention relates to the field of integrated circuit, and more particularly to one-time-programmable memory (OTP).

2. Prior Art

Three-dimensional one-time-programmable memory (3D-OTP) is a monolithic semiconductor memory. It comprises a plurality of vertically stacked OTP cells. In a conventional OTP, the memory cells are formed on a two-dimensional (2-D) plane (i.e. on a semiconductor substrate). In contrast, the memory cells of the 3D-OTP are formed in a three-dimensional (3-D) space. The 3D-OTP has a large storage density and a low storage cost. Because the 3D-OTP has a long data retention (>100 years), it is suitable for long-term data storage.

U.S. Pat. No. 5,838,396 issued to Zhang on Nov. 10, 1998 discloses a 3D-OTP 00. It comprises a semiconductor substrate 0 and a plurality of OTP memory levels 100, 200 stacked above the semiconductor substrate 0. Among them, the memory level 200 is stacked above the memory level 100. Transistors in the substrate 0 and interconnects thereof form a substrate circuit (including the peripheral circuit of the OTP memory levels 100, 200). Each OTP memory level (e.g. 100) comprises a plurality of address lines (e.g. word lines 20a, 20b . . . , and bit lines 30a, 30b . . . ) and memory cells (e.g. 1aa-1bb . . . ). Each OTP memory level 100 further comprises a plurality of OTP arrays. Each OTP array is a collection of all OTP cells which share at least one address line. Contact vias 20av, 30av couple the address lines 20a, 30a with the substrate 0.

The 3D-OTP in Zhang is a single-bit-per-cell 3D-OTP, wherein each 3D-OTP cell stores a single bit. Namely, each OTP cell has two states '1' and '0': the '1' OTP cell is in a low-resistance state, whereas the '0' cell is in a high-resistance state. To further improve the storage density and lower the storage cost, it is desired to store more bits in each 3D-OTP cell.

OBJECTS AND ADVANTAGES

It is a principle object of the present invention to provide a 3D-OTP with a large storage capacity.

It is a further object of the present invention to provide a 3D-OTP with a low storage cost.

It is a further object of the present invention to provide a properly working 3D-OTP even with leaky OTP cells.

It is a further object of the present invention to provide a properly working 3D-OTP even under external interferences.

In accordance with these and other objects of the present invention, the present invention discloses a multi-bit-per-cell 3D-OTP.

SUMMARY OF THE INVENTION

The present invention discloses a multi-bit-per-cell three-dimensional one-time-programmable memory (3D-$OTP_{MB}$). It comprises a plurality of OTP cells stacked above a semiconductor substrate. Each OTP cell comprises an antifuse layer, which is irreversibly switched from a high-resistance state to a low-resistance state during programming. By adjusting the magnitude of the programming currents, the programmed antifuses have different resistances. Using the resistance to represent the digital states, the OTP cells have N (N>2) states: 0, 1, . . . N−1, whose respective resistances are $R_0$, $R_1$, . . . $R_{N-1}$, with $R_0 > R_1 > \ldots > R_{N-1}$. Having N states, each OTP cell stores more than one bit.

To minimize read error due to leaky OTP cells, the present invention discloses a full-read mode. For the full-read mode, the states of all OTP cells on a selected word line are read out during a read cycle. The read cycle includes two read phases: a pre-charge phase and a read-out phase. During the pre-charge phase, all address lines (including all word and all bit lines) in an OTP array are charged to an input bias voltage of an amplifier associated with the OTP array. During the read-out phase, after its voltage is raised to the read voltage $V_R$, a selected word line starts to charge all bit lines through the associated OTP cells. By measuring the voltage change on the bit lines, the states of the associated OTP cells can be determined.

To minimize read error due to external interferences, the present invention further discloses a differential amplifier for measuring the states of the OTP cells. One input of the differential amplifier is the bit-line voltage $V_b$ from a data OTP cell (i.e. the OTP cell that stores data), while the other input is a reference voltage $V_{ref}$ from a dummy OTP cell (i.e. the OTP cell that provides $V_{ref}$ for the differential amplifier). Like the data OTP cells, the dummy OTP cells have N states. The value of the reference voltage (e.g. $V_{ref,1}$) is between the voltages (e.g. $V_{"0"}$, $V_{"1"}$) on the bit lines associated with the dummy OTP cells in adjacent states (e.g. '0', '1'), preferably equal to the average of the two. To determine the state of a selected data OTP cell, N−1 measurements are taken. The data OTP cell is in the state 'k' if $V_{ref,k-1} < V_b < V_{ref,k}$ (k=1, 2, . . . N−1).

Accordingly, the present invention discloses a multi-bit-per-cell 3D-OTP (3D-$OTP_{MB}$), comprising: a semiconductor substrate including transistors thereon; a plurality of OTP cells stacked above said semiconductor substrate, each of said OTP cells comprising an antifuse layer, where said antifuse layer is irreversibly switched from a high-resistance state to a low-resistance state during programming; a plurality of contact vias coupling said OTP cells to said semiconductor substrate; wherein said OTP cells have more than two states, the OTP cell in different states being programmed by different programming currents.

The present invention further discloses a multi-bit-per-cell 3D-OTP (3D-$OTP_{MB}$), comprising: a semiconductor substrate including transistors thereon; a plurality of OTP cells stacked above said semiconductor substrate each of said OTP cells comprising an antifuse layer, where said antifuse layer is irreversibly switched from a high-resistance state to a low-resistance state during programming; a plurality of contact vias coupling said OTP cells to said semiconductor substrate; wherein the resistance of said antifuse layer is determined by a programming current, said OTP cells being programmed by at least two programming currents.

BRIEF DESCRIPTION OF THE DRAWINGS

FIG. 7A is a circuit block diagram of a first preferred OTP array comprising differential amplifiers.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. In FIG. 6A, FIG. 7A, FIG. 8A and FIG. 9, solid dots represent programmed OTP cells, while open dots represent unprogrammed OTP cells. The symbol "/" means a relationship of "and" or "or".

Throughout the present invention, the phrase "on the substrate" means the active elements of a circuit are formed on the surface of the substrate, although the interconnects between these active elements are formed above the substrate and do not touch the substrate; the phrase "above the substrate" means the active elements are formed above the substrate and do not touch the substrate.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 1:
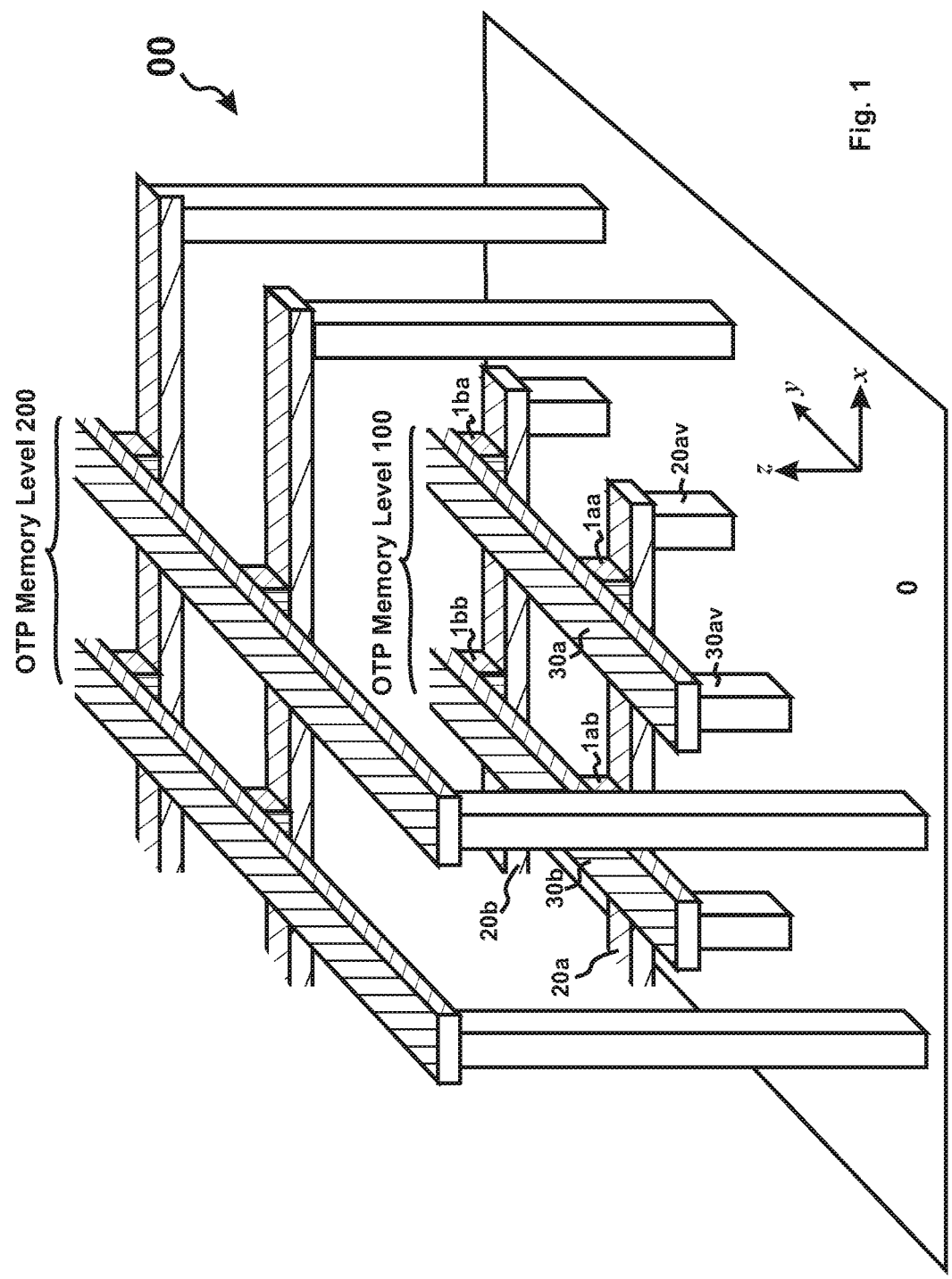
FIG. 1 is a perspective view of a 3D-OTP.
Figure 2A:
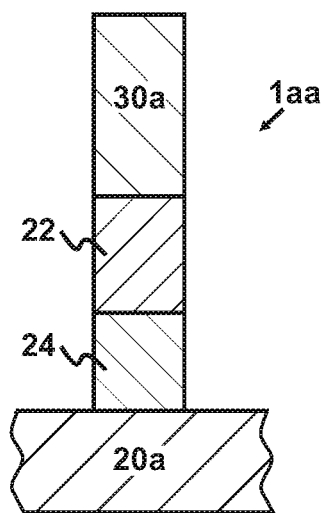
FIGS. 2A-2D are cross-sectional views of four preferred 3D-OTP cells in different states.
Figure 2B:
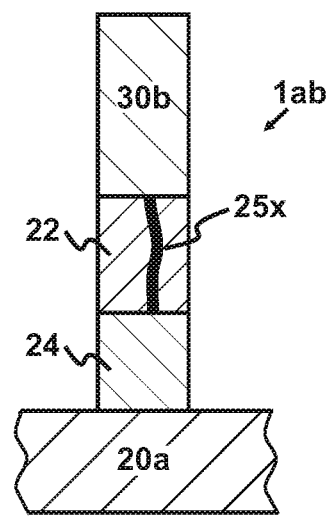
Figure 2C:
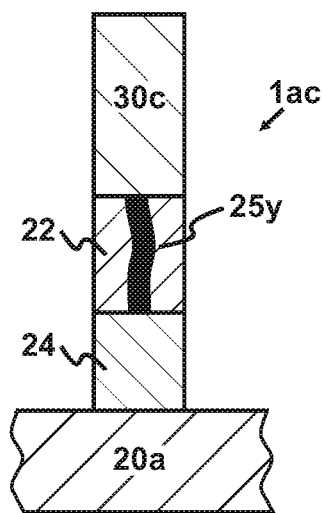
Figure 2D:
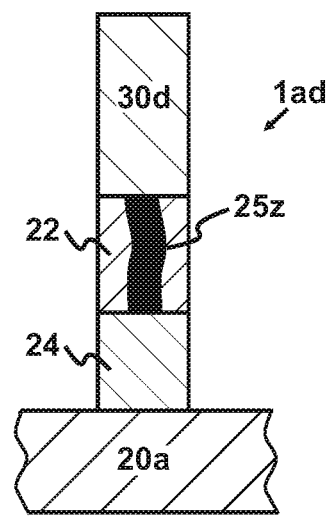

Referring now to FIG. 2A-2D, four preferred OTP cells 1aa-1ad are disclosed. They are in the states: '0', '1', '2', '3', respectively. Each OTP cell (e.g. 1aa) comprises a top electrode 30a, a bottom electrode 20a, an antifuse layer 22 and a quasi-conductive layer 24. The antifuse layer 22 has high resistance before programming (FIG. 2A), and is irreversibly switched to low resistance after programming (FIGS. 2B-2D). The quasi-conductive has the following properties: its resistance at the read voltage (i.e. the read resistance) is substantially lower than when the applied voltage has a magnitude smaller than or polarity opposite to that of the read voltage.

Because the OTP cell 1aa is unprogrammed, no conductive filament is formed in its antifuse layer 22. On the other hand, because the OTP cells 1ab-1ad are programmed, conductive filaments 25x-25z of different sizes are formed therein. Among them, the conductive filament 25x of the OTP cell 1ab is thinnest and has the largest resistance; the conductive filament 25z of the OTP cell 1ad is thickest and has the lowest resistance; the conductive filaments 25y of the OTP cell 1ac has an intermediate size and therefore, has an intermediate resistance.

Figure 3:
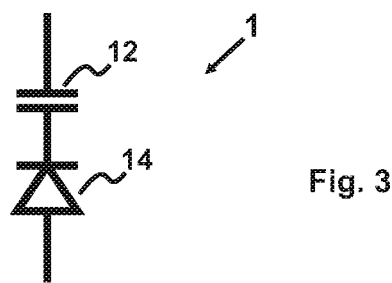
FIG. 3 is a symbol of an OTP cell.

FIG. 3 is a symbol of an OTP cell 1. It comprises an antifuse 12 and a diode 14. The antifuse 12 comprises the antifuse layer 22 and its resistance is irreversibly switched from high to low during programming. The diode 14 comprises the quasi-conductive layer 24 and is broadly interpreted as any two-terminal device whose resistance at the read voltage is substantially lower than when the applied voltage has a magnitude smaller than or polarity opposite to that of the read voltage.

Figure 4A:
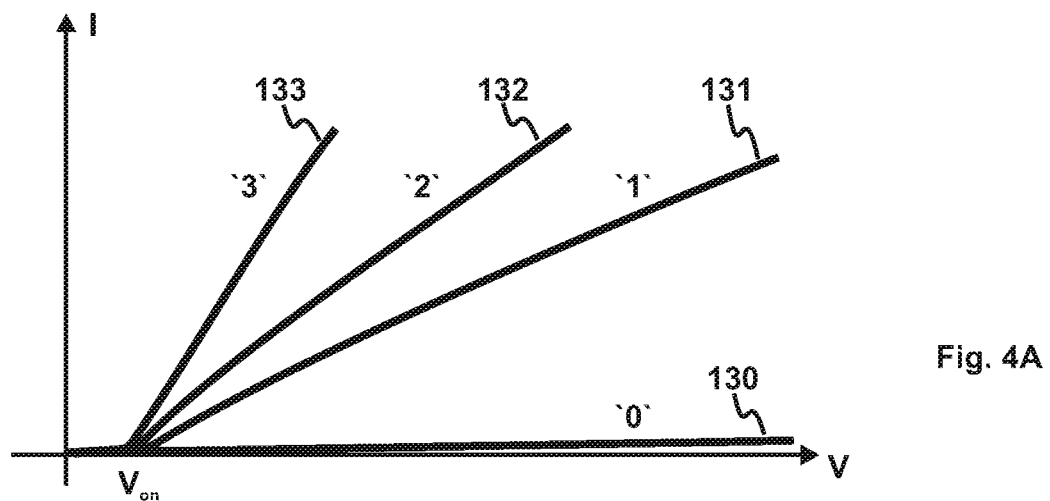
FIG. 4A shows a current-voltage (I-V) characteristics of four preferred OTP cells in different states.
Figure 4B:
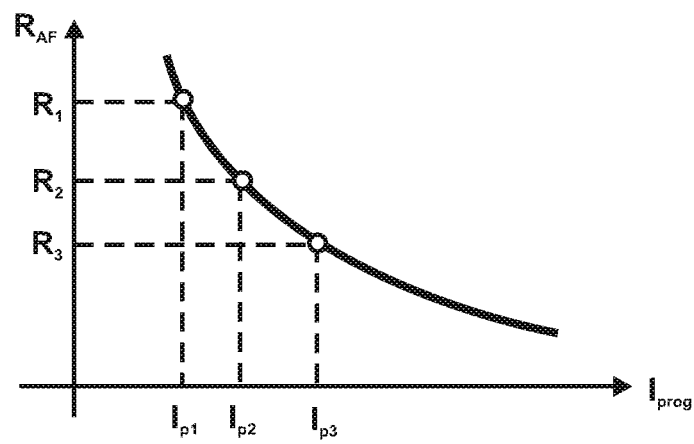
FIG. 4B shows a relationship between the resistance of the programmed antifuse and the programming current ($R_{AF}$-$I_P$).

Referring now to FIGS. 4A-4B, the electrical characteristics of the '0'-'3' OTP cells are disclosed. FIG. 4A shows current-voltage (I-V) characteristics of the '0'-'3' OTP cells. The I-V curve 130 corresponds to a '0' OTP cell 1aa; the I-V curve 131 corresponds to a '1' OTP cell 1ab; the I-V curve 132 corresponds to a '2' OTP cell 1ac; the I-V curve 133 corresponds to a '3' OTP cell 1ad. The diode 14 has a turn-on voltage $V_{on}$. Once the applied voltage is larger than $V_{on}$, the resistance of the diode 14 drops rapidly. At this time, the resistance of the OTP cell 1 primarily comes from the antifuse layer 12.

FIG. 4B shows a relationship between the resistance of the programmed antifuse ($R_{AF}$) and the programming current ($I_P$). As $R_{AF}$ is inversely proportional to $I_P$, the programmed antifuse would have different $R_{AF}$ by adjusting $I_P$. For the state '1', the programming current $I_{P1}$ is relatively small, thus the antifuse resistance $R_1$ is relatively large. For the state '3', the programming current $I_{P3}$ is relatively large, thus the antifuse resistance $R_3$ is relatively small. The state '2' is between the states '1' and '3'. Overall, $I_{P1} < I_{P2} < I_{P3}$ leads to $R_1 > R_2 > R_3$.

Figure 5A:
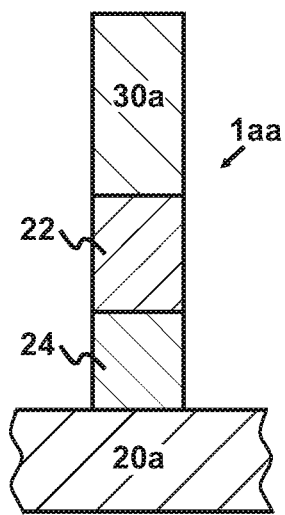
FIGS. 5A-5C are cross-sectional views of three preferred 3D-OTP cells.
Figure 5B:
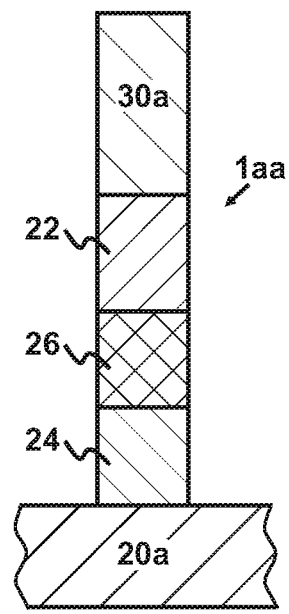
Figure 5C:
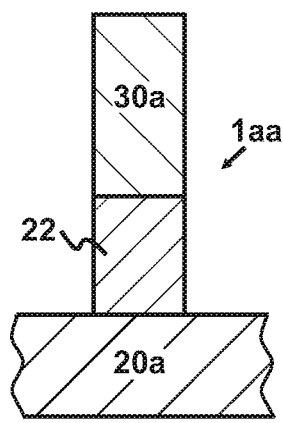

Referring now to FIGS. 5A-5C, three preferred 3D-OTP cells 1aa are shown. In the preferred embodiment of FIG. 5A, the bottom electrode (word line) 20a comprises a metallic or highly doped semiconductor material. The top electrode (bit line) 30a comprises a metallic or highly doped semiconductor material. The antifuse layer 22 is a layer of insulating dielectric (e.g. silicon oxide, silicon nitride). The quasi-conductive layer 24 is used to form a diode 14. For a semiconductor diode 14, the bottom electrode 20a comprises a P+ semiconductor material, the quasi-conductive layer 24 comprises an N-semiconductor material, while the top electrode 30a comprises an N+ semiconductor material. Alternatively, the bottom electrode 20a comprises a metallic material, the quasi-conductive layer 24 comprises a P+/N−/N+ diode, while the top electrode 30a comprises another metallic material. For a Schottky diode 14, the bottom electrode 30a comprises a metallic material, the quasi-conductive layer 24 comprises an N− semiconductor material, while the top electrode 30a comprises an N+ semiconductor material. For a ceramic diode 14, the bottom electrode 30a comprises a metallic material, the quasi-conductive layer 24 comprises a ceramic material (e.g. a layer of metal oxide), while the top electrode 30a comprises another metallic material.

The preferred embodiment of FIG. 5B is similar to that of FIG. 5A, except that a conductive layer 26 separates the antifuse layer 22 from the quasi-conductive layer 24. The conductive layer 26 preferably comprises at least a metallic material, which minimizes heat damage to the quasi-conductive layer 24 during programming. The preferred embodiment of FIG. 5C is even simpler than those of FIGS. 5A-5B in that it does not comprise a separate quasi-conductive layer. After the antifuse layer 22 is ruptured, a diode is naturally formed at the junction of the top electrode 30a and the bottom electrode 20a. As an example, the bottom electrode 20a comprises a highly doped P+ semiconductor material and the top electrode 20a comprises a highly doped N+ semiconductor material. For those skilled in the art, the OTP cell 1aa could take other forms.

Figure 6A:
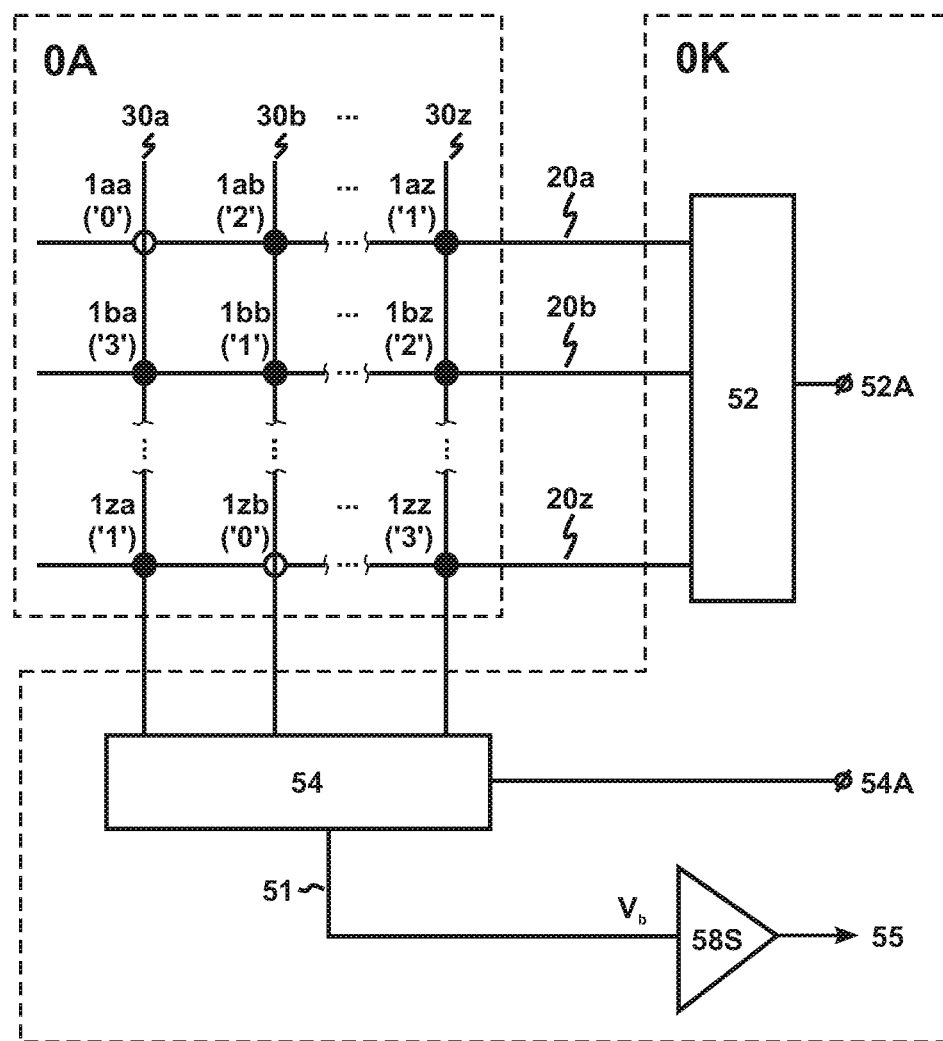
FIG. 6A is a circuit block diagram of a preferred OTP array in the full-read mode.
Figure 6B:
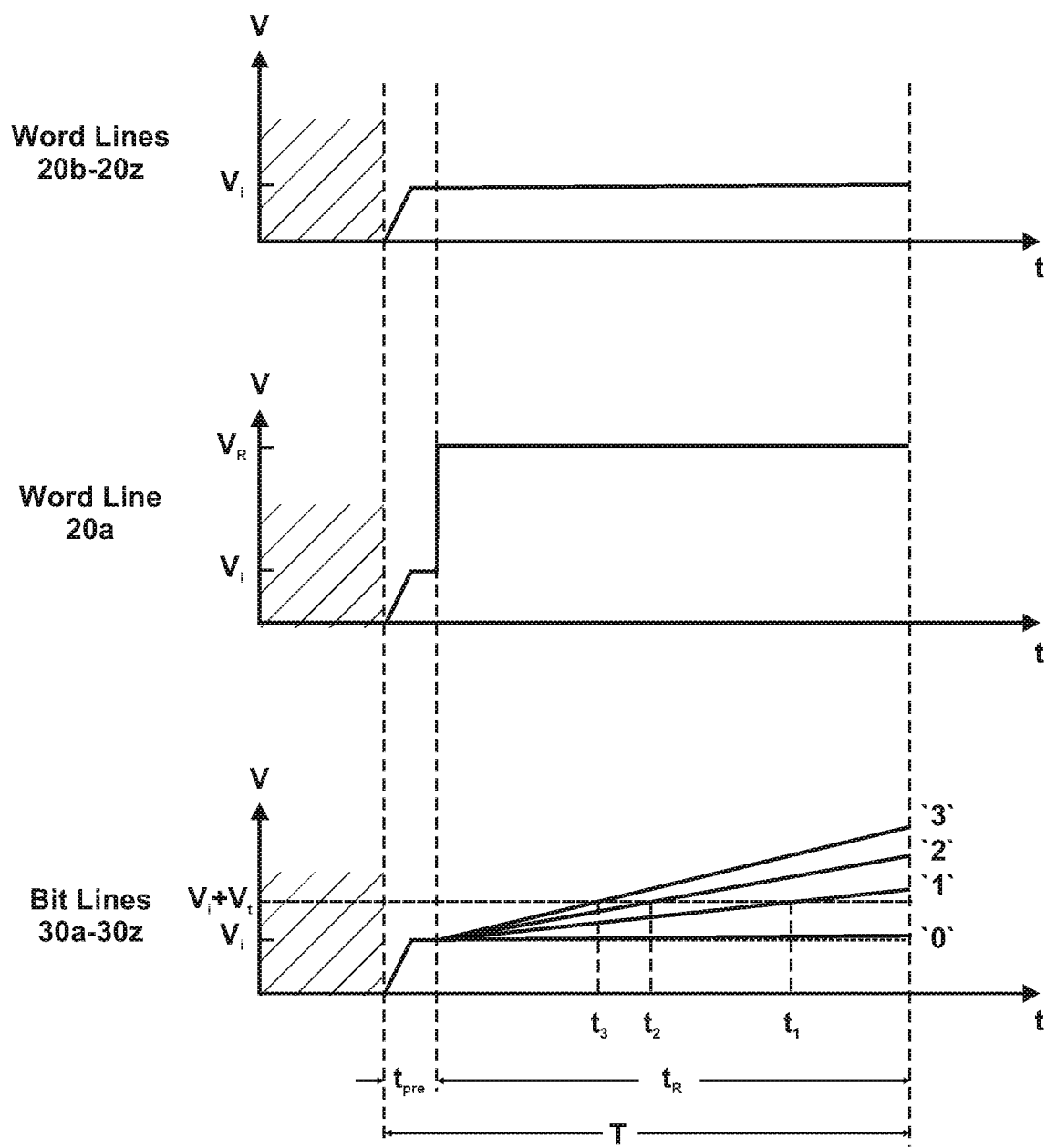
FIG. 6B is its signal timing diagram.

To minimize read error due to leaky OTP cells, the present invention discloses a full-read mode. For the full-read mode, all OTP cells on a selected word line are read out during a read cycle T. FIGS. 6A-6B discloses a preferred OTP array OA in the full-read mode. The OTP array OA comprises word lines 20a-20z, bit lines 30a-30z and OTP cells 1aa-1zz (the numbers in the parenthesis represent the states of the OTP cells) (FIG. 6A). The preferred embodiment further comprises a single-ended amplifier 58S. The read cycle T includes two read phases: a pre-charge phase $t_{pre}$ and a read-out phase $t_R$ (FIG. 6B). During the pre-charge phase $t_{pre}$, all address lines 20a-20z, 30a-30z in the OTP array OA are charged to an input bias voltage $V_i$ of the amplifier 58S.

During the read-out phase $t_R$, all bit lines 30a-30z are floating. Based on the row address 52A, the row decoder 52 raises the voltage on a selected word line 20a to the read voltage $V_R$, while voltage on unselected word lines 20b-20z remains at the input bias voltage $V_i$. After this, the selected word line 20a starts to charge the bit lines 30a-30z through the OTP cells 1aa-1az and the voltages on the bit lines 30a-30z begin to rise. At this time, the voltage on each bit line is sent to the amplifier 58S by rotating the column address 54A. For each column address 54A, the column decoder 54 selects a bit line (e.g. 30b) and sends its voltage $V_b$ to the input 51 of the amplifier 58S. When the value of the voltage $V_b$ exceeds the threshold voltage $V_T$ of the amplifier 58S, the output 55 is toggled. By measuring the toggling time, the state of each OTP cell (e.g. the OTP cell 1ab at the intersection of the selected word line 20a and the selected bit line 30b) can be determined.

During the above measurement, because the $V_T$ of the amplifier 58S is relatively small (~0.1V or smaller), the voltage changes delta(V) on the bit lines 30a-30z are small. The largest voltage change delta$(V)_{max}$~N*$V_T$ is far less than the read voltage $V_R$. As long as the characteristics of the OTP cell satisfies I$(V_R)$>>I(-N*$V_T$), the 3D-OTP$_{MB}$ would work properly even with leaky OTP cells.

Figure 7B:
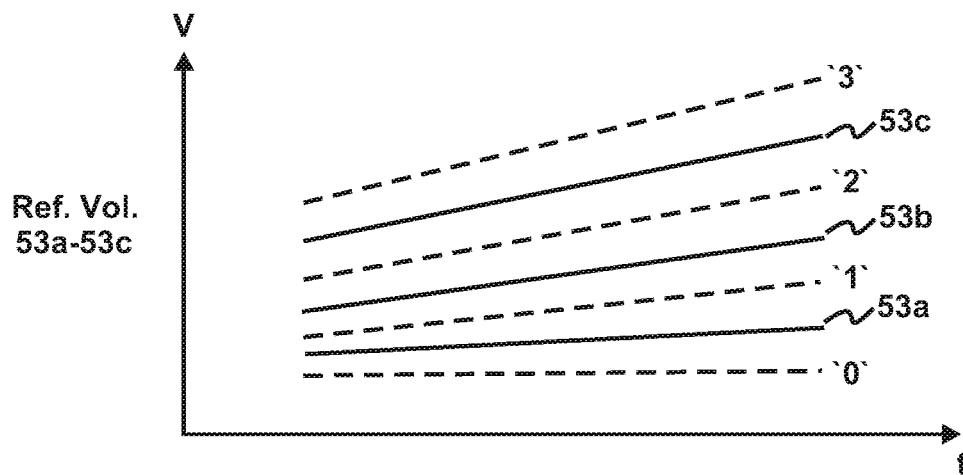
FIGS. 7B-7C are the signal timing diagrams for the reference voltages and the bit-line voltages, respectively.
Figure 7C:
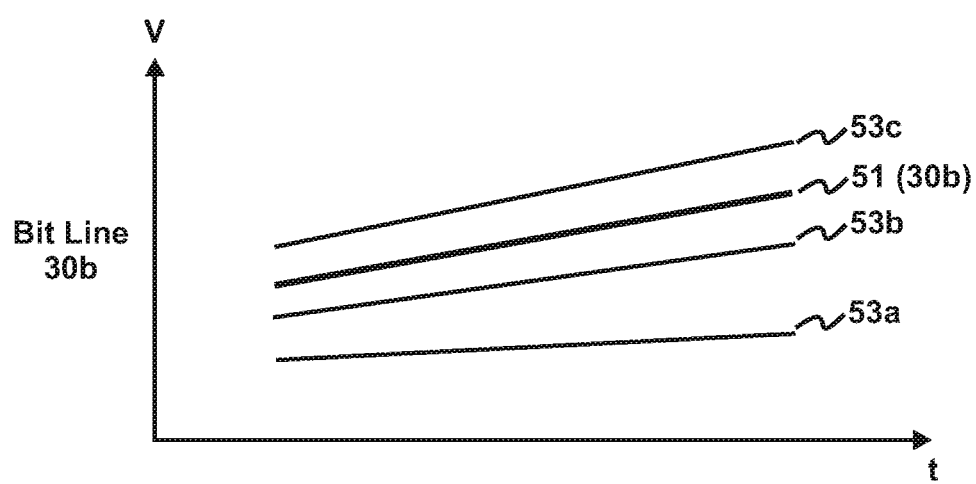

To minimize read error due to external interferences, the present invention further discloses differential amplifiers for measuring the states of the OTP cells. FIGS. 7A-C disclose a first preferred OTP array OA with differential amplifiers. In addition to the regular bit line 30a-30z and OTP cells 1aa-1zz (FIG. 6A), the preferred OTP array OA further comprises dummy bit lines 31a-31f and dummy OTP cells 1a0-1z5 (FIG. 7A). For clarity, the regular bit line 30a-30z are referred to as data bit lines, while the regular OTP cells 1aa-1zz are referred to as data OTP cells. The dummy bit lines 31a-31f form a dummy bit-line set 30DY, while the data bit lines 30a-30z form a data bit-line set 30DT.

This preferred embodiment further comprises N−1 (in this case, =3) differential amplifiers 58a-58c (FIG. 7A). All differential amplifiers 58a-58c comprise two inputs: first inputs are the bit-line voltage $V_b$ from a data OTP cell (i.e. the OTP cell stores data), while second inputs are the reference voltages $V_{ref,1}$-$V_{ref,3}$. For example, the reference voltage for the differential amplifier 58a is $V_{ref,1}$~($V_{·0'}$+$V_{·1'}$)/2; the reference voltage for the differential amplifier 58b is $V_{ref,2}$~($V_{·1'}$+$V_{·2'}$)/2; and, the reference voltage for the differential amplifier 58c is $V_{ref,3}$~($V_{·2'}$+$V_{·3'}$)/2. As used herein, (i=0, 1, 2, or 3) is the voltage on the associated bit line when reading out a state 'i' OTP cell.

To generate these reference voltages $V_{ref,1}$-$V_{ref,3}$, the OTP array OA uses 2N−2 (in this case, =6) dummy bit lines 31a-31f. Each word line (e.g. 20a) is associated with 2N−2 (in this case, =6) dummy OTP cells (e.g. 1a0-1a5). Like the data OTP cells 1aa-1az, the dummy OTP cells 1a0-1a5 have N states. For example, the dummy OTP cells 1aa0-1a5 on the word line 20a are in the states '0', '1', '1', '2', '2', '3', '3', respectively (FIG. 7A). The reference voltage $V_{ref,1}$ on the second input 53a of the amplifier 58a is generated by shorting the dummy bit lines 31c (coupled with a '0' dummy OTP cell 1a0) and 31b (coupled with a '1' dummy OTP cell 1a1). Namely, $V_{ref}$=($V_{31a}$±$V_{31b}$)/2=($V_{·0'}$+$V_{·1'}$)/2 (FIG. 7B). The reference voltage $V_{ref,2}$ on the second input 53b of the amplifier 58b is generated by shorting the dummy bit lines 31c (coupled with a '1' dummy OTP cell 1a2) and 31d (coupled with a '2' dummy OTP cell 1a3). Namely, $V_{ref,2}$=($V_{31c}$±$V_{31d}$)/2=($V_{·1'}$+$V_{·2'}$)/2. The reference voltage $V_{ref,3}$ on the second input 53c of the amplifier 58c is generated by shorting the dummy bit lines 31e (coupled with a '2' dummy OTP cell 1a4) and 31f (coupled with a '3' dummy OTP cell 1a5). Namely, $V_{ref,3}$=($V_{31e}$+$V_{31f}$)/2=($V_{·2'}$+$V_{·3'}$)/2.

To determine the state of a selected data OTP cell, N−1 measurements are taken concurrently at the N−1 amplifiers 58a-58c. The data OTP cell is in the state 'k' if $V_{ref,k-1}$<$V_b$<$V_{ref,k}$ (k=1, 2, . . . N−1). For example, to measure the state of the data OTP cell 1ab, the column decoder 54 sends the voltage on the bit line 30b to the first inputs of all amplifiers 58a-58c. The amplifiers 58a-58c make three measurements concurrently (FIG. 7C). As the data OTP cell 1ab is in the state '2', the bit-line voltage $V_b$ on the first input 51 is larger than the reference voltages $V_{ref,1}$, $V_{ref,2}$ on the second inputs 53a, 53b of the amplifiers 58a, 58b, respectively. However, $V_b$ is smaller than $V_{ref,3}$ on the second input 53c of the amplifier 58c. Thus, the outputs 55a-55c of the amplifiers 58a-58c are high, high, low. Accordingly, the state of the data OTP cell 1ab can be determined.

Figure 8A:
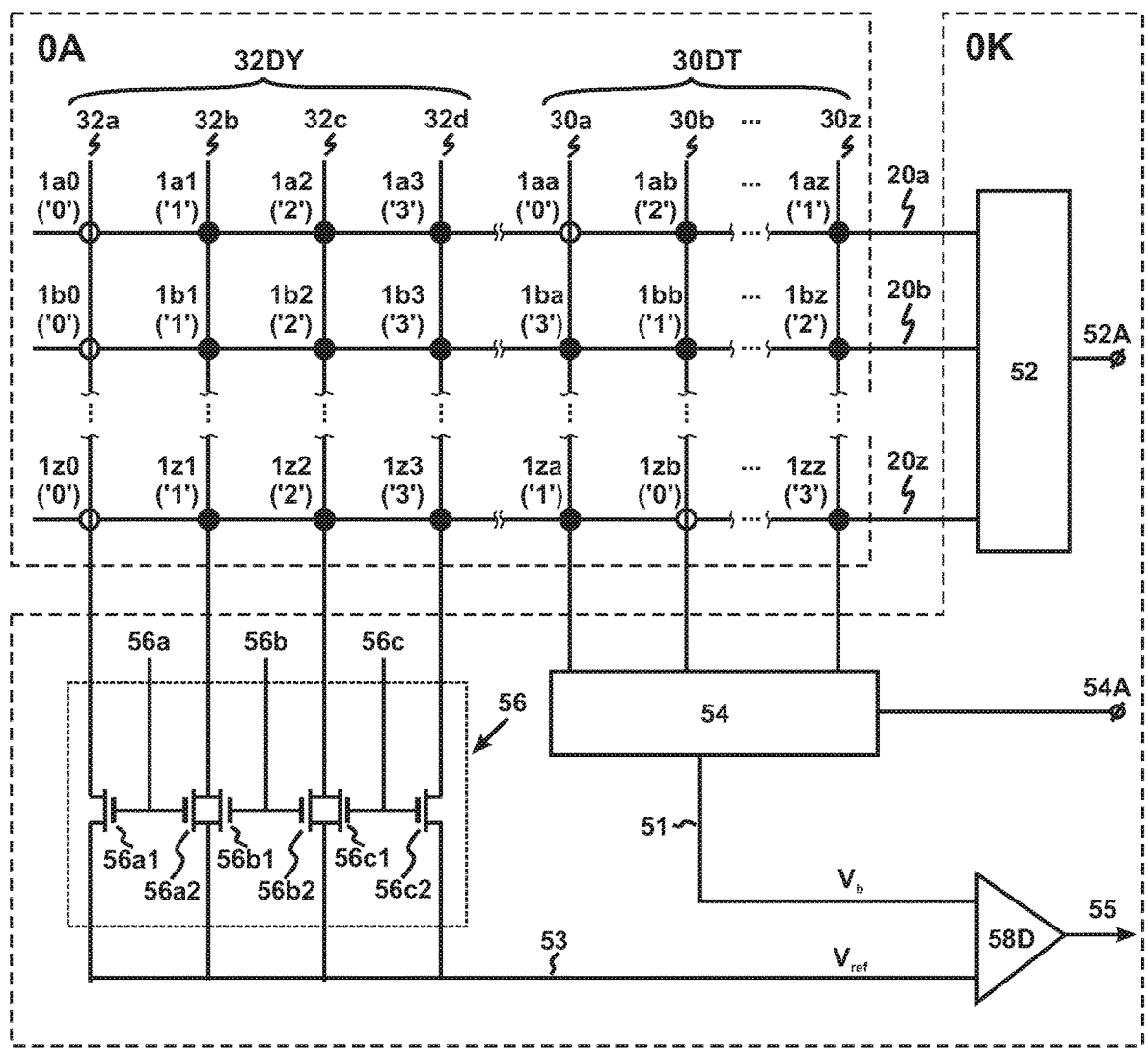
FIG. 8A is a circuit block diagram of a second preferred OTP array comprising a differential amplifier.
Figure 8B:
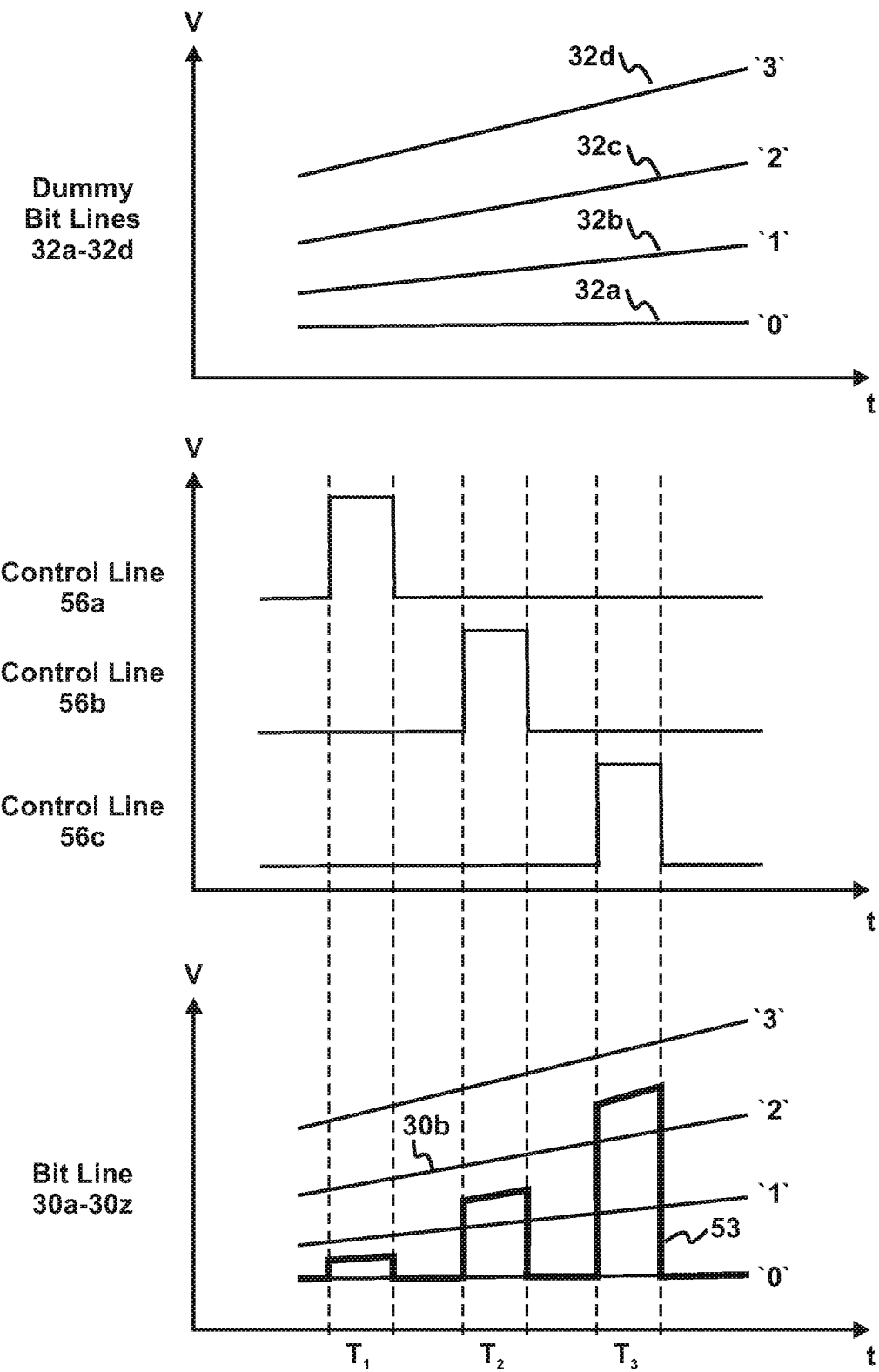
FIG. 8B is its signal timing diagram.

FIGS. 8A-8B discloses a second preferred OTP array OA comprising an amplifier. Instead of three amplifiers 58a-58c (FIG. 7A), it uses a single amplifier 58D (FIG. 8A). The first input of the amplifier 58D is the bit-line voltage $V_b$ of a selected data OTP cell, while the second input is a selected reference voltage $V_{ref}$. This preferred embodiment uses fewer dummy bit lines and dummy OTP cells than FIG. 7A. The OTP array OA comprises only N (in this case, =4) dummy bit lines 32a-32d and each word line (e.g. 20a) is coupled with N dummy OTP cells (e.g. 1a0-1a3). Like the data OTP cells 1aa-1az, the dummy OTP cells 1a0-1a3 have N states. For example, the dummy OTP cells 1aa0-1a3 on the word line 20a are in the states '0', '1', '2', '3', respectively (FIG. 8A). Adjacent dummy bit lines (e.g. 32a, 32b) are coupled through a pair of pass transistors (e.g. 56a1, 56a2), which is controlled by a control signal 56a. An appropriate reference voltage $V_{ref}$ is generated by asserting the corresponding control signals. For example, by asserting the control signal 56a, the passing transistors 56a1, 56a2 is turned on and the reference voltage $V_{ref}$ is equal to the average of the voltages on the dummy bit lines 32a, 32b. Namely, $V_{ref}=V_{32a}\pm V_{32b}=(V_{\cdot 0}+V_{\cdot 1})/2$.

To determine the state of a selected data OTP cell, N−1 measurements are taken sequentially at the amplifier 58D (FIG. 8B). The OTP cell is in the state 'k' if $V_{ref,k-1}<V_b<V_{ref,k}$ (k=1, 2, . . . N−1). For example, to determine the state of the data OTP cell 1ab, the column decoder 54 sends the voltage $V_b$ (=$V_{\cdot 2}$) on the bit line 30b to the first input 51 of the amplifier 58D. Three sequential measurements are taken. During the first measurement $T_1$, the control signal 56a is asserted to turn on the pass transistors 56a1, 56a2. The reference voltage $V_{ref}$ on the second input 53 of the amplifier 58D is $V_{ref}=(V_{\cdot 0}+V_{\cdot 1})/2$. As $V_{ref}<V_b$, the output 55 of the amplifier 58D is high. Similarly, during the second measurement $T_2$, by turning on the pass transistors 56b1, 56b2, the output 55 of the amplifier 58D stays high as $V_{ref}=(V_{\cdot 1}+V_{\cdot 2})/2<V_b$; during the third measurement $T_3$, by turning on the pass transistors 56c1, 56c2, the output 55 of the amplifier 58D turns low as $V_{ref}=(V_{\cdot 2}+V_{\cdot 3})/2>V_b$. By analyzing the results from three measurements $T_1$-$T_3$, the state of the data OTP cell 1ab can be determined.

In the preferred embodiments of FIGS. 6A-8B, the row decoder 52, the column decoder 54 and the amplifier 58S, 58a-58c, 58D are formed on the substrate 0 and are a portion of the substrate circuit OK. The OTP array OA is stacked above the substrate circuit OK and covers at least a portion thereof. The 3D-OTP$_{MB}$ has a small die size and a low die cost.

Figure 9:
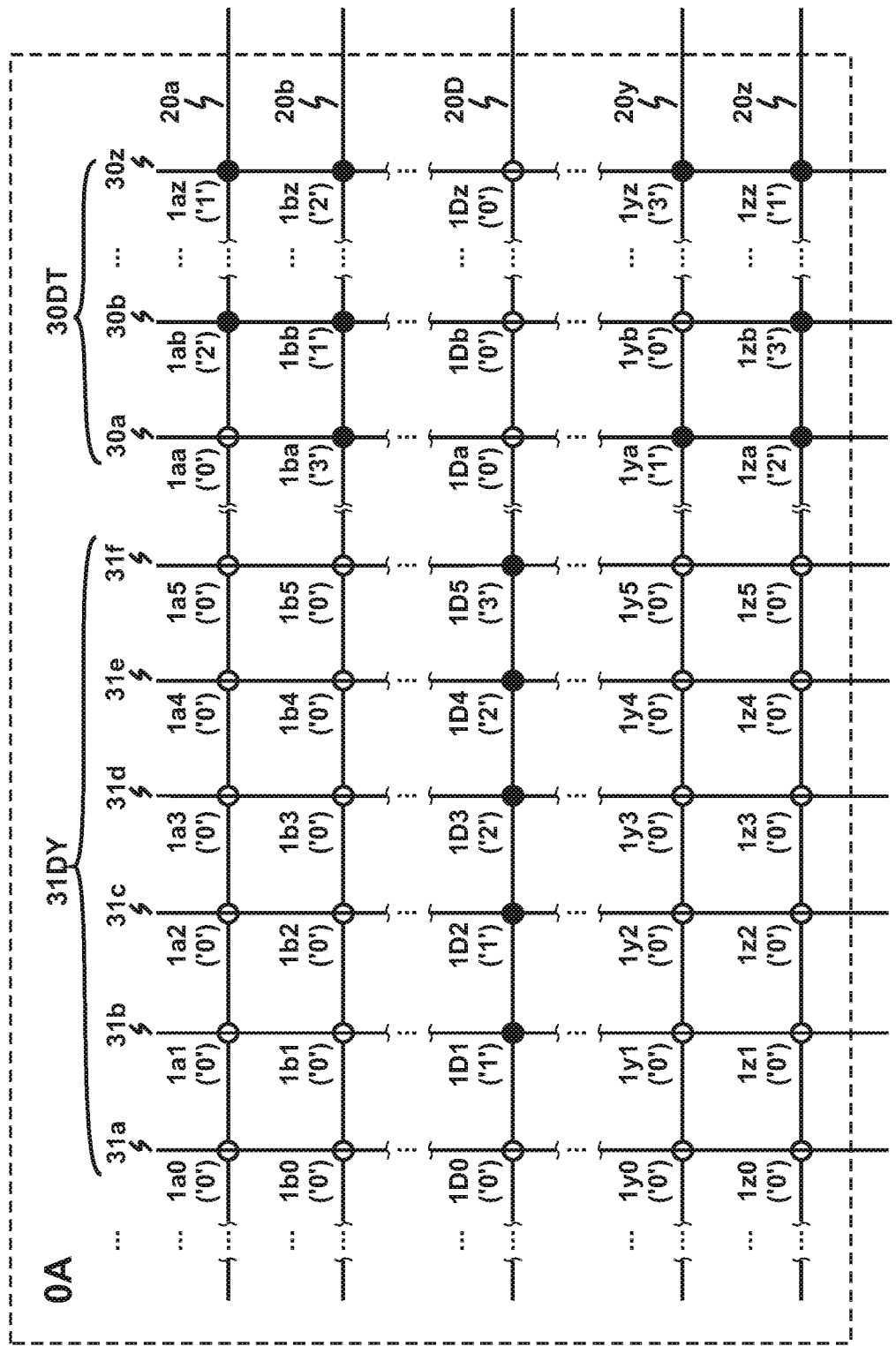
FIG. 9 is a preferred 3D-OTP comprising a dummy word line.

All dummy OTP cells need to be pre-programmed before shipping. During pre-programming, the resistances of the dummy OTP cells need to be adjusted precisely. For the preferred embodiment of FIG. 7A (or, FIG. 8A), each word line 20a is associated with 2N−2 (or, N) dummy OTP cells. The total number of the dummy OTP cells in the OTP array OA (with M data word lines and N data bit lines) is (2N−2)*M (or, N*M). Pre-programming all of them is time consuming and costly. To reduce the pre-programming time, the present invention further discloses a dummy word line. FIG. 9 discloses a preferred OTP array OA comprising a dummy word line 20D. In addition to the data word lines 20a, 20b, . . . 20y, 20z, the preferred OTP array OA comprises a dummy word line 20D. The pre-programming is only carried out to the dummy OTP cells 1D1-1D5 located at the intersections of the dummy word line 20D and the dummy bit lines 31b-31f. Because majority of the dummy OTP cells (e.g. 1a0-1b5, 1y0-1z5) do not need pre-programming, the pre-programming time is significantly reduced.

During read, both voltages on the selected data word line (e.g. 20a) and the dummy word line 20D are raised to $V_R$. Because the dummy OTP cells 1Da-1Dz at the intersections of the dummy word line 20D and the data bit lines 30a-30z are unprogrammed, the voltage rise on the dummy word line 20D would not affect the signals on the data bit lines 30a-30z. Moreover, because the dummy OTP cells 1a0-1a5 at the intersections of the data word line 20a and the dummy bit lines 31a-31f are unprogrammed, the voltage rise on the data word line 20a would not affect the signals on the dummy bit lines 31a-31f, either. Accordingly, the operation of this preferred embodiment is similar to those in FIGS. 7A-8B.

In the preferred embodiments of FIGS. 7A-9, to manufacture high-quality dummy OTP cells, all dummy word line, dummy bit lines and dummy OTP cells are preferably formed in the middle of the OTP array OA. For example, the dummy word line 20D is formed in the middle of the OTP array OA, so are the dummy bit lines 31a-31f.

Although examples disclosed in these figures are horizontal 3D-OTP (i.e. the OTP memory levels 100, 200 are horizontal), the inventive spirit can be extended to vertical 3D-OTP (i.e. the OTP memory strings are vertical to the substrate). More details of the vertical 3D-OTP are disclosed in Chinese Patent Application No. 201610234999.5, filed on Apr. 16, 2017.

While illustrative embodiments have been shown and described, it would be apparent to those skilled in the art that many more modifications than that have been mentioned above are possible without departing from the inventive concepts set forth therein. For example, beside N=4 (i.e. each OTP cell stores two bits), the present invention can be extended to N=8 (i.e. each OTP cell stores three bits) or more. The invention, therefore, is not to be limited except in the spirit of the appended claims.

What is claimed is:

1. A multi-bit-per-cell three-dimensional read-only memory (3D-OTP$_{MB}$) with at least three states including first, second and third states, comprising:
   a semiconductor substrate with transistors thereon;
   an OTP array stacked above said semiconductor substrate, comprising:
     a plurality of data OTP cells including a first data OTP cell in said first state, a second data OTP cell in said second state, and a third data OTP cell in said third state;
     a first dummy OTP cell in said first state and a first dummy bit line associated therewith;
     a second dummy OTP cell in said second state and a second dummy bit line associated therewith;
     a third dummy OTP cell in said second state and a third dummy bit line associated therewith;
     a fourth dummy OTP cell in said third state and a fourth dummy bit line associated therewith;
   a plurality of contact vias coupling said OTP array to said semiconductor substrate;
   a first differential amplifier on said semiconductor substrate, said first differential amplifier having a first input coupled with said first and second dummy bit lines, having a second input coupled with a first selected one of said data OTP cells;
   a second differential amplifier on said semiconductor substrate, said second differential amplifier having a third input coupled with said third and fourth dummy bit lines, having a fourth input coupled with a second selected one of said data OTP cells;
   wherein said first data OTP cell and said first dummy OTP cell are unprogrammed; said second data OTP cell, said second dummy OTP Cell and said third dummy OTP cell are programmed by a first programming current; and, said third data OTP cell and said fourth dummy OTP cell are programmed by a second programming current different from said first programming current.

2. The 3D-OTP$_{MB}$ according to claim 1, wherein said second data OTP cell has a larger resistance than said third data OTP cell.

3. The 3D-OTP$_{MB}$ according to claim 1, wherein said first programming current is smaller than said second programming current.

* * * * *